US011574824B2

(12) United States Patent
Aoyama et al.

(10) Patent No.: US 11,574,824 B2
(45) Date of Patent: Feb. 7, 2023

(54) HEAT TREATMENT METHOD INCLUDING LOW TEMPERATURE DEGASSING BEFORE FLASH LAMP ANNEAL AND HEAT TREATMENT APPARATUS THEREOF

(71) Applicant: SCREEN HOLDINGS CO., LTD., Kyoto (JP)

(72) Inventors: Takayuki Aoyama, Kyoto (JP); Shinichi Kato, Kyoto (JP); Kazuhiko Fuse, Kyoto (JP); Hikaru Kawarazaki, Kyoto (JP); Masashi Furukawa, Kyoto (JP); Hideaki Tanimura, Kyoto (JP); Akitsugu Ueda, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 1083 days.

(21) Appl. No.: 16/312,872

(22) PCT Filed: Apr. 4, 2017

(86) PCT No.: PCT/JP2017/014016
§ 371 (c)(1),
(2) Date: Dec. 21, 2018

(87) PCT Pub. No.: WO2018/020742
PCT Pub. Date: Feb. 1, 2018

(65) Prior Publication Data
US 2019/0164789 A1 May 30, 2019

(30) Foreign Application Priority Data
Jul. 25, 2016 (JP) .............................. JP2016-145235

(51) Int. Cl.
*H01L 21/67* (2006.01)
*H01L 21/02* (2006.01)
(Continued)

(52) U.S. Cl.
CPC .... *H01L 21/67115* (2013.01); *C23C 16/4412* (2013.01); *C23C 16/45557* (2013.01);
(Continued)

(58) Field of Classification Search
CPC ......... H01L 21/67115; H01L 21/02164; H01L 21/02337; H01L 21/2636; H01L 21/265;
(Continued)

(56) References Cited

U.S. PATENT DOCUMENTS

2010/0178776 A1  7/2010  Kato
2013/0078786 A1  3/2013  Fuse et al.
(Continued)

FOREIGN PATENT DOCUMENTS

CN  105742209 A  7/2016
JP  09-55480 A  2/1997
(Continued)

OTHER PUBLICATIONS

Taiwanese Office Action issued in corresponding Taiwanese Patent Application No. 106115137, dated Dec. 26, 2017, with partial English Translation.
(Continued)

*Primary Examiner* — John P. Dulka
(74) *Attorney, Agent, or Firm* — McDermott Will & Emery LLP

(57) ABSTRACT

A semiconductor wafer to be treated is heated at a first preheating temperature ranging from 100 to 200° C. while a pressure in a chamber housing the semiconductor wafer is reduced to a pressure lower than an atmospheric pressure. After the semiconductor wafer is preheated to increase the temperature into a second preheating temperature ranging from 500 to 700° C. while the pressure in the chamber is restored to a pressure higher than the reduced pressure, a flash lamp emits a flashlight to a surface of the semicon-
(Continued)

ductor wafer. Heating the semiconductor wafer at the first preheating temperature that is a relatively low temperature enables, for example, the moisture absorbed on the surface of the semiconductor wafer in trace amounts to be desorbed from the surface, and also enables the flash heating treatment to be performed with oxygen derived from such absorption removed as much as possible.

1 Claim, 10 Drawing Sheets

(51) Int. Cl.
H01L 29/78 (2006.01)
H01L 21/265 (2006.01)
C23C 16/44 (2006.01)
C23C 16/455 (2006.01)
C23C 16/48 (2006.01)
H01L 21/263 (2006.01)

(52) U.S. Cl.
CPC ...... *C23C 16/482* (2013.01); *H01L 21/02164* (2013.01); *H01L 21/02337* (2013.01); *H01L 21/265* (2013.01); *H01L 21/2636* (2013.01); *H01L 21/67248* (2013.01); *H01L 29/78* (2013.01)

(58) Field of Classification Search
CPC ............... H01L 21/67248; H01L 29/78; H01L 21/2686; C23C 16/4412; C23C 16/45557; C23C 16/482; C23C 16/40; C23C 16/56
See application file for complete search history.

(56) References Cited

U.S. PATENT DOCUMENTS

| 2013/0260546 | A1 | 10/2013 | Yamada et al. |
| 2014/0004696 | A1 | 1/2014 | Kitabayashi |
| 2016/0187063 | A1 | 6/2016 | Segawa et al. |
| 2017/0221722 | A1* | 8/2017 | Timans ............. H01L 21/67115 |

FOREIGN PATENT DOCUMENTS

| JP | 2004-356500 A | 12/2004 |
| JP | 2005-064052 A | 3/2005 |
| JP | 2009-164635 A | 7/2009 |
| JP | 2010-165713 A | 7/2010 |
| JP | 2013-073946 A | 4/2013 |
| JP | 2013-120859 A | 6/2013 |
| JP | 2013-207033 A | 10/2013 |
| TW | 201320191 A | 5/2013 |
| WO | 2014/002603 A1 | 1/2014 |

OTHER PUBLICATIONS

International Search Report issued in corresponding International Patent Application No. PCT/JP2017/014016, dated May 30, 2017, with English Translation.

Japanese Notice of Reasons for Refusal issued in corresponding Japanese Patent Application No. 2016-145235, dated Sep. 1, 2020, with English translation.

* cited by examiner

F I G . 2
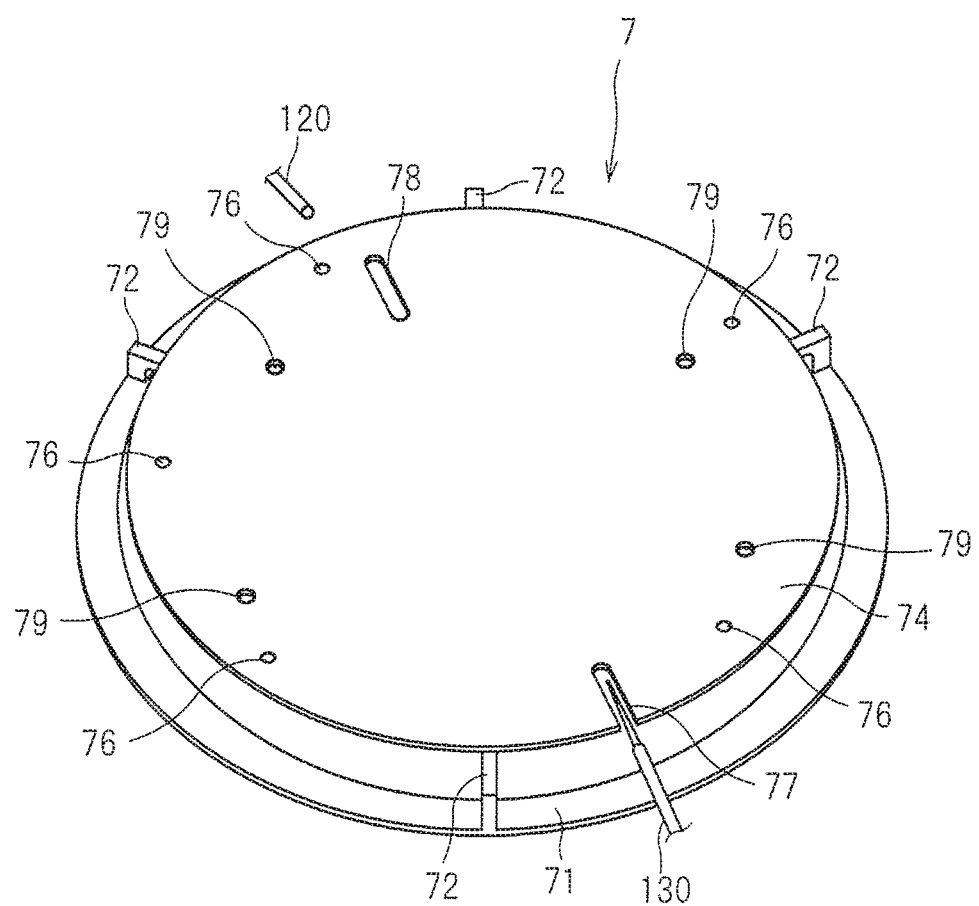

F I G . 9
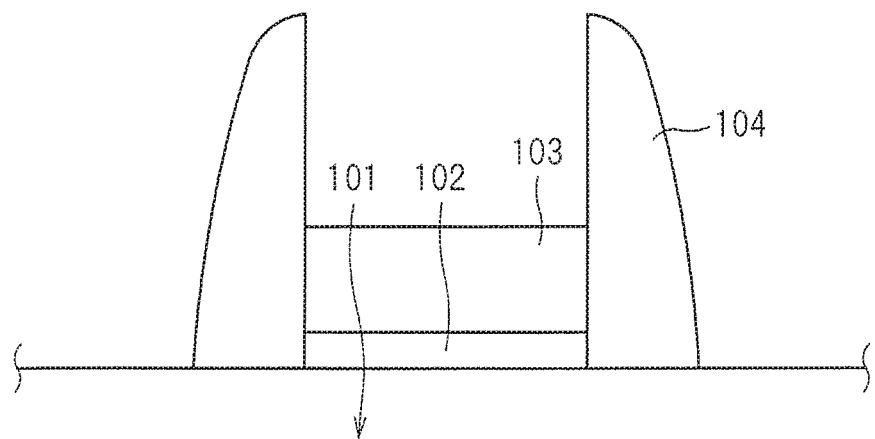

HEAT TREATMENT METHOD INCLUDING LOW TEMPERATURE DEGASSING BEFORE FLASH LAMP ANNEAL AND HEAT TREATMENT APPARATUS THEREOF

CROSS REFERENCE

This application is the U.S. National Phase under 35 US.C. § 371 of International Application No. PCT/JP2017/014016, filed on Apr. 4, 2017, which claims the benefit of Japanese Application No. 2016-145235, filed on Jul. 25, 2016, the entire contents of each are hereby incorporated by reference.

TECHNICAL FIELD

The present invention relates to a heat treatment method and a heat treatment apparatus for heating a lamellar precise electronic substrate (will be hereinafter simply referred to as a "substrate") such as a semiconductor wafer by emitting a flashlight to the substrate.

BACKGROUND ART

In the process of manufacturing semiconductor devices, attention is being given to flash lamp annealing (FLA) for heating semiconductor wafers in a very short period of time. The flash lamp annealing relates to a heat treatment technology for increasing the temperature of only the surface of the semiconductor wafers in a very short period of time (shorter than or equal to several milliseconds) by emitting flashlights to the surface using a xenon flash lamp (simply being referred to as "a flash lamp" will mean this xenon flash lamp hereinafter).

The spectral power distribution of the xenon flash lamp ranges from the ultraviolet region to the near-infrared region. The light produced by the xenon flash lamp has a wavelength shorter than that of a conventional halogen lamp, and has a fundamental absorption band almost identical to that of a semiconductor wafer made of silicon. Thus, when the xenon flash lamp emits a flashlight to the semiconductor wafer, it can rapidly increase the temperature of the semiconductor wafer with less transmitted light. It turns out that the temperature of only the vicinity of the surface of the semiconductor wafer can be selectively increased with emission of a flashlight in a very short period of time less than or equal to several milliseconds.

This kind of flash lamp annealing is applied to treatment requiring heating for a very short period of time, for example, typically to activation of impurities implanted into a semiconductor wafer. When a flash lamp emits a flashlight to the surface of the semiconductor wafer into which impurities have been implanted by an ion implantation method, the temperature of the surface of the semiconductor wafer can be increased to an activation temperature for only a very short period of time, which allows only activation of the impurities without deeply diffusing the impurities.

Application of a high dielectric constant thin film (high-k film) using a material higher in dielectric constant than silicon dioxide ($SiO_2$) (a high-dielectric constant material) as a gate insulating film for a field effect transistor (FET) that has been recently developed is under study. The high dielectric constant thin film has been developed as a new stack structure together with a metal gate electrode using a metal as a gate electrode to solve a problem with increase in the leakage current along with the progress in thinning of the gate insulating film. Application of the flash lamp annealing to heat treatment for a semiconductor wafer with a new stack structure including such a high dielectric constant thin film is also under study.

The high dielectric constant thin film is formed by depositing a high-dielectric constant material on a substrate made of silicon using a method such as metal organic chemical vapor deposition (MOCVD). Although having a higher dielectric constant than that of a conventional silicon oxide film, the high dielectric constant thin film has low crystallinity immediate after the deposition, and has many defects such as point defect. For example, Patent Document 1 proposes heating treatment on the surface of a semiconductor wafer including a high dielectric constant thin film for a very short period of time with emission of a flashlight to the surface due to the necessity of annealing the deposited high dielectric constant thin film at a high temperature.

PRIOR ART DOCUMENTS

Patent Documents

Patent Document 1: Japanese Patent Application Laid-Open No. 2013-73946

SUMMARY

Problem to be Solved by the Invention

It turns out, however, that a mere flash heating treatment on the semiconductor wafer including the high dielectric constant thin film for a very short period of time simply with emission of a flashlight as disclosed in Patent Document 1 causes a problem with failing to obtain a high dielectric constant due to increase in the thickness of a silicon oxide film formed as the foundation of the high dielectric constant thin film. Increase in the thickness of the silicon oxide film is caused by the heating treatment with oxygen present. The oxygen causing the increase in the film thickness may be derived from oxygen absorbed on the surface of the semiconductor wafer (typically, absorbed as moisture).

The present invention has been conceived in view of the problem, and the object is to provide a heat treatment method and a heat treatment apparatus which enable the flash heating treatment with oxygen removed as much as possible.

Means to Solve the Problem

In order to solve the problem, one aspect of the present invention is a heat treatment method for heating a substrate by emitting a flashlight to the substrate, the method comprising the steps of: (a) transporting the substrate into a chamber; (b) degassing the substrate by heating the substrate in the chamber at a first preheating temperature ranging from 100 to 200° C.; (c) preheating the substrate in the chamber at a second preheating temperature higher than the first preheating temperature; and (d) emitting the flashlight from a flash lamp to a front surface of the substrate.

The second aspect is, in the heat treatment method according to the first aspect, exhausting a gas in the chamber to reduce a pressure in the chamber into a first pressure lower than an atmospheric pressure in the step (b).

The third aspect is, in the heat treatment method according to the second aspect, restoring the pressure in the chamber from the first pressure to a second pressure higher than the first pressure in the step (c).

The fourth aspect is a heat treatment apparatus that heats a substrate by emitting a flashlight to the substrate, the apparatus comprising: a chamber housing the substrate; a preheater preheating the substrate housed in the chamber; a flash lamp emitting a flashlight to a front surface of the substrate preheated in the chamber; and a controller controlling the preheater so that the preheater heats the substrate at a first preheating temperature ranging from 100 to 200° C. and then at a second preheating temperature higher than the first preheating temperature.

The fifth aspect is that the heat treatment apparatus according to the fourth aspect further comprises: an exhaust part exhausting an atmosphere in the chamber; and a gas supply part supplying a predetermined treatment gas to the chamber, wherein the controller controls the exhaust part when the substrate is heated at the first preheating temperature so that the exhaust part exhausts a gas in the chamber to reduce a pressure in the chamber into a first pressure lower than an atmospheric pressure.

The sixth aspect is that in the heat treatment apparatus according to the fifth aspect, the controller controls the exhaust part and the gas supply part when the substrate is heated at the second preheating temperature so that the pressure in the chamber is restored from the first pressure to a second pressure higher than the first pressure.

The seventh aspect is that in the heat treatment apparatus according to the fourth aspect, the preheater includes a continuous lighting lamp.

Effects of the Invention

In the heat treatment method according to the first to third aspects, heating the substrate at the first preheating temperature ranging from 100 to 200° C. enables, for example, the moisture absorbed on the surface of the substrate in trace amounts to be desorbed from the surface, and also enables the flash heating treatment to be performed with oxygen derived from such absorption removed as much as possible.

Since the heat treatment apparatus according to the fourth to seventh aspects heats the substrate at the first preheating temperature ranging from 100 to 200° C. and then at the second preheating temperature higher than the first preheating temperature, the moisture absorbed on the surface of the substrate in trace amounts can be desorbed from the surface, and the flash heating treatment can be performed with oxygen derived from such absorption removed as much as possible.

BRIEF DESCRIPTION OF DRAWINGS

FIG. 2 is a perspective view showing the entire external appearance of a holder.
FIG. 9 illustrates a stack structure in which a high dielectric constant thin film is deposited on a semiconductor wafer.

DESCRIPTION OF EMBODIMENT

A preferred embodiment of the present invention will be described in detail with reference to the drawings.

Figure 1:
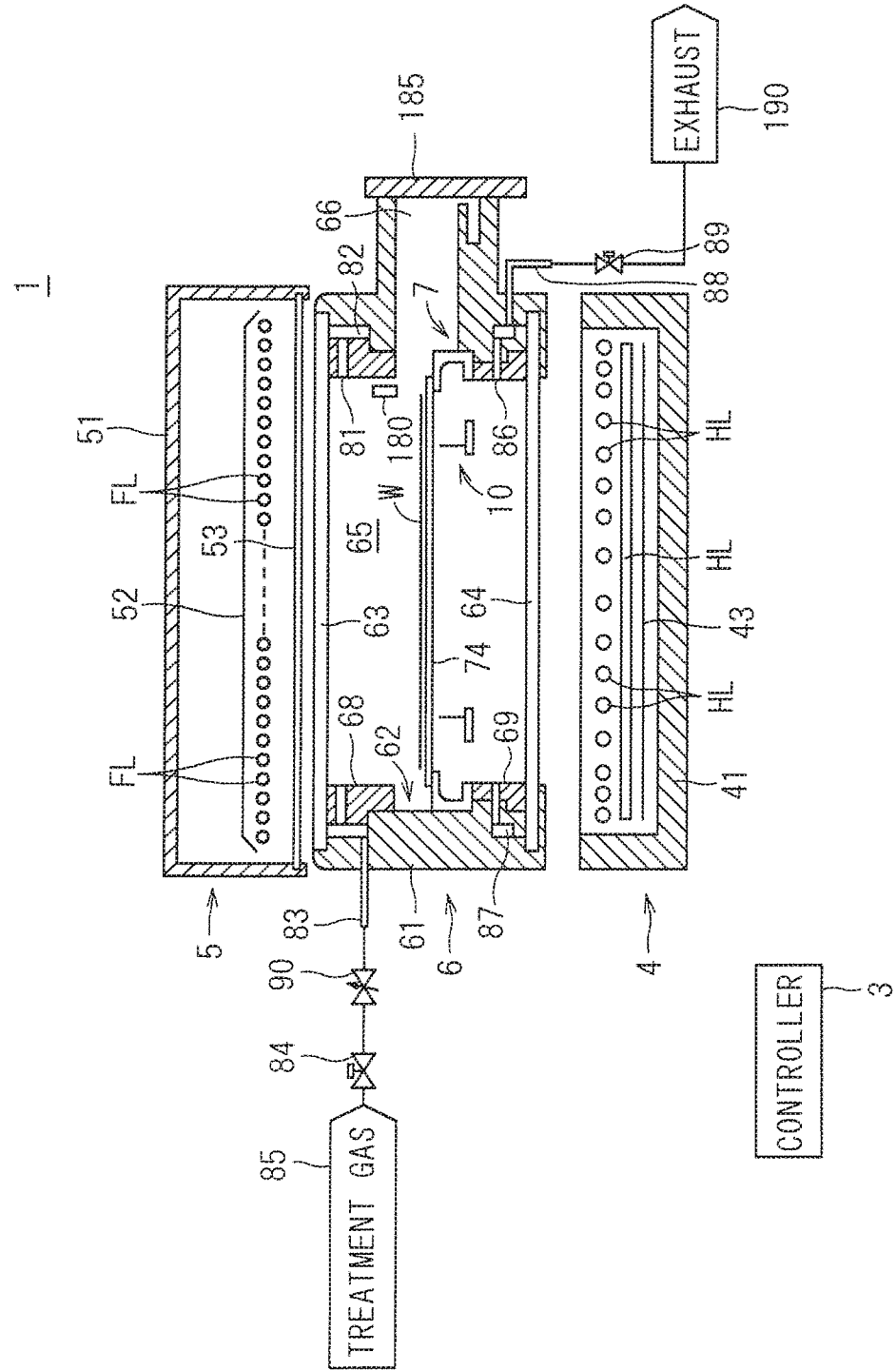
FIG. 1 is a longitudinal sectional view showing a structure of a heat treatment apparatus according to the present invention.

FIG. 1 is a longitudinal sectional view showing a structure of a heat treatment apparatus 1 according to the present invention. The heat treatment apparatus 1 according to the preferred embodiment is a flash lamp annealer that heats a disk-shaped semiconductor wafer W serving as a substrate by emitting a flashlight to the semiconductor wafer W. The size of the semiconductor wafer W to be treated is, but not particularly limited to, 300 mm or 450 mm in diameter, for example. A high dielectric constant thin film is formed on the semiconductor wafer W before being transported into the heat treatment apparatus 1. The heat treatment apparatus 1 performs heating treatment to execute post deposition annealing (PDA) on the high dielectric constant thin film. It should be noted that dimensions and the number of components in FIG. 1 and the subsequent figures are shown in exaggeration or in simplified form as appropriate for the sake of easier understanding.

The heat treatment apparatus 1 includes a chamber 6 that houses the semiconductor wafer W, a flash heater 5 including a plurality of flash lamps FL, and a halogen heater 4 including a plurality of halogen lamps HL. The flash heater 5 is provided above the chamber 6, and the halogen heater 4 is provided below the chamber 6. The heat treatment apparatus 1 also includes, within the chamber 6, a holder 7 that holds the semiconductor wafer W in a horizontal attitude, and a transfer mechanism 10 that transfers the semiconductor wafer W between the holder 7 and the outside of the apparatus. The heat treatment apparatus 1 further includes a controller 3 that controls operating mechanisms located in the halogen heater 4, the flash heater 5, and the chamber 6 for heat treatment of the semiconductor wafer W.

The chamber 6 includes quartz chamber windows attached to the top and bottom of a chamber side portion 61 that is tubular. The chamber side portion 61 is substantially tubular with the top and bottom opened. The top opening has a top chamber window 63 that is closed, and the bottom opening has a bottom chamber window 64 that is closed. The top chamber window 63, which forms the ceiling portion of the chamber 6, is a disc-shaped member made of quartz and functions as a quartz window that allows the flashlights emitted from the flash heater 5 to pass through the chamber 6. The bottom chamber window 64, which forms the floor of the chamber 6, is a disc-shaped member made of quartz and functions as a quartz window that allows light emitted from the halogen heater 4 to pass through the chamber 6. The top chamber window 63 and the bottom chamber window 64 are, for example, approximately 28 mm thick.

A reflection ring 68 is mounted on the upper portion of the inner wall surface of the chamber side portion 61, and a reflection ring 69 is mounted on the lower portion thereof. Both of the reflection rings 68 and 69 are formed annular. The upper reflection ring 68 is fitted from above the chamber side portion 61. On the other hand, the lower reflection ring 69 is fitted from below the chamber side portion 61 and fastened with screws that are not illustrated. In other words, the reflection rings 68 and 69 are both removably mounted on the chamber side portion 61. An interior space of the chamber 6, i.e. a space surrounded by the top chamber window 63, the bottom chamber window 64, the chamber side portion 61, and the upper and lower reflection rings 68 and 69, is defined as a heat treatment space 65.

A recessed portion 62 is formed in the inner wall surface of the chamber 6 by fitting the upper and lower reflection rings 68 and 69 to the chamber side portion 61. In other words, the recessed portion 62 is formed by being surrounded by a lower end face of the reflection ring 68, an upper end face of the reflection ring 69, and a central portion of the inner wall surface of the chamber side portion 61 to which the reflection rings 68 and 69 are not fitted. The recessed portion 62 is formed annular horizontally along the inner wall surface of the chamber 6, and surrounds the holder 7 that holds the semiconductor wafer W.

The chamber side portion 61 and the reflection rings 68 and 69 are made of a metal material (e.g., stainless steel) superior in strength and heat resistance. The inner circumferential surfaces of the reflection rings 68 and 69 are mirror-finished by electrolytic nickel plating.

The chamber side portion 61 has a transport opening (throat) 66 through which the semiconductor wafer W is transported into and out of the chamber 6. The transport opening 66 is openable and closable with a gate valve 185. The transport opening 66 is connected in communication with an outer peripheral surface of the recessed portion 62. Thus, when the transport opening 66 is opened by the gate valve 185, the semiconductor wafer W can be transported into and out of the heat treatment space 65 through the transport opening 66 and the recessed portion 62. When the transport opening 66 is closed by the gate valve 185, the heat treatment space 65 in the chamber 6 is made airtight.

A gas supply opening 81 for supplying the heat treatment space 65 with a treatment gas (nitrogen gas ($N_2$) and ammonia ($NH_3$) in the preferred embodiment) is formed in an upper portion of the inner wall of the chamber 6. The gas supply opening 81 is formed above the recessed portion 62, and may be provided in the upper reflection ring 68. The gas supply opening 81 is connected in communication with a gas supply pipe 83 through a buffer space 82 formed annular inside the side wall of the chamber 6. The gas supply pipe 83 is connected to a gas supply source 85. Under control of the controller 3, the gas supply source 85 feeds, to the gas supply pipe 83, nitrogen gas or a mixed gas of ammonia and nitrogen gas as the treatment gas. A valve 84 and a flow rate adjustment valve 90 are inserted at some midpoint in the gas supply pipe 83. When the valve 84 is opened, the treatment gas is fed from the gas supply source 85 to the buffer space 82. The flow rate adjustment valve 90 adjusts the flow rate of the treatment gas to be fed to the buffer space 82 through the gas supply pipe 83. The flow rate of the treatment gas defined by the flow rate adjustment valve 90 is variable under control of the controller 3. The treatment gas flows to be spread within the buffer space 82, which is lower in fluid resistance than that of the gas supply opening 81, and is supplied into the heat treatment space 65 through the gas supply opening 81. Examples of the treatment gas include, not limited to nitrogen gas and ammonia, inert gases such as argon (Ar) and helium (He), reactive gases such as oxygen ($O_2$), hydrogen ($H_2$), chlorine ($Cl_2$), hydrogen chloride (HCl), ozone ($O_3$), nitrogen monoxide (NO), nitrous oxide ($N_2O$), and nitrogen dioxide ($NO_2$).

A gas exhaust opening 86 for exhausting a gas from the heat treatment space 65 is formed in a lower portion of the inner wall of the chamber 6. The gas exhaust opening 86 is formed below the recessed portion 62, and may be provided in the reflection ring 69. The gas exhaust opening 86 is connected in communication with a gas exhaust pipe 88 through a buffer space 87 formed annular inside the side wall of the chamber 6. The gas supply pipe 88 is connected to an exhaust part 190. A valve 89 is inserted at some midpoint in the gas exhaust pipe 88. When the valve 89 is opened, the gas in the heat treatment space 65 is exhausted to the gas exhaust pipe 88 through the gas exhaust opening 86 and the buffer space 87. The gas supply opening 81 and the gas exhaust opening 86 may be formed in a plurality of portions in a circumferential direction of the chamber 6, and may be slits.

Figure 8:
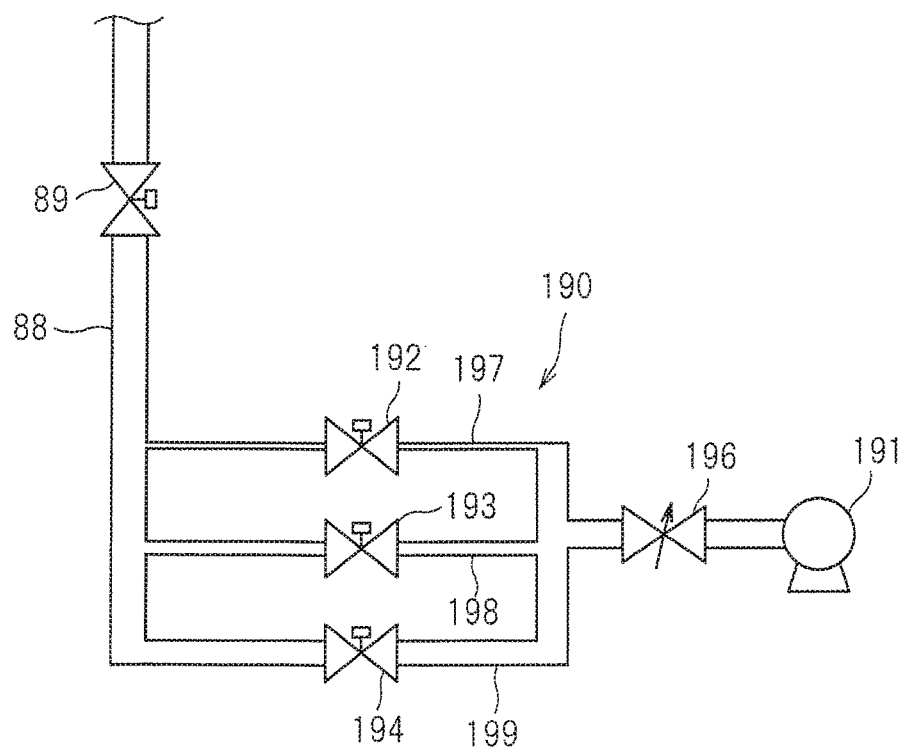
FIG. 8 illustrates a structure of an exhaust part.

FIG. 8 illustrates a structure of the exhaust part 190. The exhaust part 190 includes an exhaust pump 191, a flow rate adjustment valve 196, three bypass lines 197, 198, and 199, and three exhaust valves 192, 193, and 194. The gas exhaust pipe 88 for directing exhaust from the chamber 6 is connected to the exhaust pump 191 through the three bypass lines 197, 198, and 199. The three bypass lines 197, 198, and 199 are formed in parallel to one another. The three bypass lines 197, 198, and 199 have different pipe diameters. The bypass line 197 has the smallest diameter. The bypass line 199 has the largest diameter. The bypass line 198 has a diameter between them. Thus, the flow rates of gas that can be passed through the bypass lines 197, 198, and 199 increase in the order of the bypass lines 197, 198, and 199.

The exhaust valves 192, 193, and 194 are provided for the bypass lines 197, 198, and 199, respectively. In other words, the exhaust valve 192 is inserted into the bypass line 197, the exhaust valve 193 is inserted into the bypass line 198, and the exhaust valve 194 is inserted into the bypass line 199. When the three exhaust valves 192, 193, and 194 are opened while the exhaust pump 191 is operated, the exhaust from the chamber 6 directed by the gas exhaust pipe 88 is sucked by the exhaust pump 191 through the respective bypass lines 197, 198, and 199.

Since the three bypass lines 197, 198, and 199 have different pipe diameters, the exhaust capacities are also different. As the diameter is larger, the exhaust capacity increases. The exhaust capacity increases in the order of the bypass lines 197, 198, and 199. Thus, the exhaust flow rate from the chamber 6 can be controlled, depending on which one of the three exhaust valves 192, 193, and 194 is opened and closed. Only one of the three exhaust valves 192, 193, and 194 or two or three thereof may be opened. When, for example, only the exhaust valve 192 is opened and the exhaust valves 193 and 194 are closed, exhaust with the lowest exhaust flow rate is discharged. When all the exhaust valves 192, 193, and 194 are opened, exhaust with the highest exhaust flow rate is discharged.

The flow rate adjustment valve 196 is inserted between the exhaust pump 191 and a junction of the three bypass lines 197, 198, and 199. The flow rate adjustment valve 196 can also adjust the exhaust flow rate from the gas exhaust pipe 88. The exhaust flow rate defined by the flow rate adjustment valve 196 is variable under control of the controller 3. The three bypass lines 197, 198, and 199 have a mechanism of adjusting the exhaust flow rate discontinuously and in multi-steps, whereas the flow rate adjustment valve 196 has a mechanism of adjusting the exhaust flow rate continuously without any steps.

The gas supply pipe 83, the gas exhaust pipe 88, and the three bypass lines 197, 198, and 199 are made of stainless steel superior in strength and corrosion resistance. A pressure gauge 180 for measuring the pressure in the heat treatment space 65 is provided in the chamber 6. The pressure gauge 180 preferably has a measuring range approximately from 5 Pa to 0.2 MPa.

Figure 3:
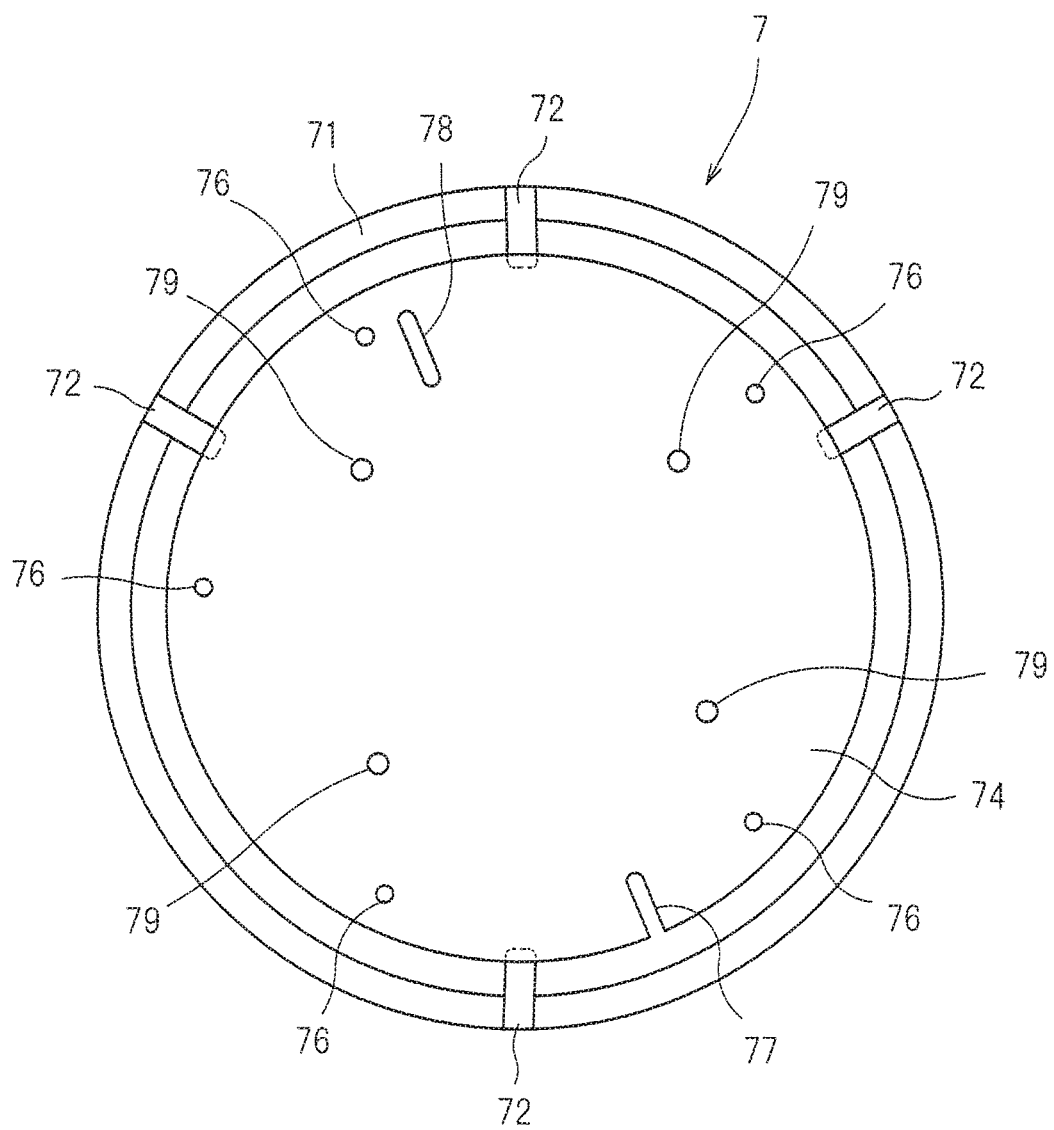
FIG. 3 is an elevated plan view of the holder from above.
Figure 4:
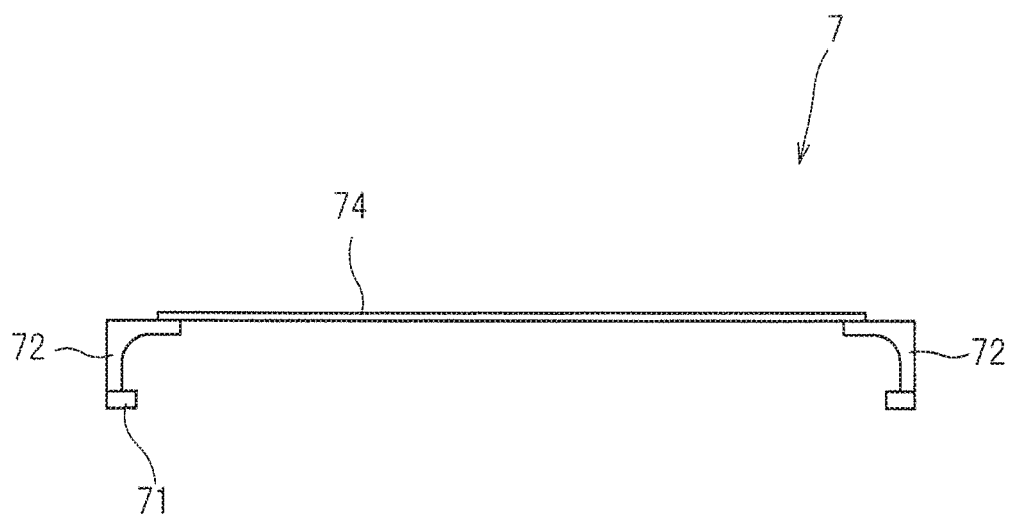
FIG. 4 is a side view of the holder from the side surface.

FIG. 2 is a perspective view showing the entire external appearance of the holder 7. FIG. 3 is an elevated plan view of the holder 7 from above. FIG. 4 is a side view of the holder 7 from the side surface. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an annular shape. The base ring 71 is supported by the wall surface of the chamber 6 by being placed on the bottom surface of the recessed portion 62 (see FIG. 1). The multiple coupling portions 72 (four coupling portions 72 in the preferred embodiment) are mounted upright on the upper surface of the base ring 71 having an annular shape, along the circumferential direction thereof. The coupling portions 72 are quartz members, and are rigidly secured to the base ring 71 by welding. The base ring 71 may have an arcuate shape obtained by removing a portion from the annular shape.

The susceptor 74 that is planar is supported by the four coupling portions 72 provided on the base ring 71. The susceptor 74 is a roughly circular and planar member made of quartz. The diameter of the susceptor 74 is greater than that of the semiconductor wafer W. In other words, the susceptor 74 is greater in plan size than the semiconductor wafer W. A plurality of guide pins 76 (five in the preferred embodiment) are mounted upright on the upper surface of the susceptor 74. The five guide pins 76 are formed around a circle concentric with the outer circumference of the susceptor 74. The diameter of the circle on which the five guide pins 76 are formed is slightly larger than that of the semiconductor wafer W. The guide pins 76 are also made of quartz. The guide pins 76 may be processed from an ingot made of quartz, integrally with the susceptor 74. Alternatively, the guide pins 76 may be separately processed and mounted to the susceptor 74, for example, by welding.

The four coupling portions 72 mounted upright on the base ring 71 are rigidly secured to the lower surface of the peripheral portion of the susceptor 74 by welding. In other words, the susceptor 74 and the base ring 71 are fixedly coupled to each other with the coupling portions 72. Thus, the holder 7 is a unitary one-piece member made of quartz. The base ring 71 of the holder 7 is supported by the wall surface of the chamber 6, whereby the holder 7 is mounted to the chamber 6. With the holder 7 mounted to the chamber 6, the susceptor 74 that is roughly disc-shaped assumes a horizontal attitude (an attitude such that the normal to the susceptor 74 coincides with a vertical direction). The semiconductor wafer W transported into the chamber 6 is placed and held in a horizontal attitude on the susceptor 74 of the holder 7 mounted to the chamber 6. The semiconductor wafer W is placed inside the circle formed by the five guide pins 76 to prevent the horizontal misregistration. The number of the guide pins 76 is not limited to five but may be any as long as the misregistration of the semiconductor wafer W can be prevented.

As shown in FIGS. 2 and 3, an opening 78 and a cutout portion 77 are formed to vertically penetrate the susceptor 74. The cutout portion 77 is formed to allow the passage of a probe tip of a contact thermometer 130 including a thermocouple. The opening 78 is provided for a radiation thermometer 120 to receive radiation (infrared radiation) emitted from the lower surface of the semiconductor wafer W held by the susceptor 74. The susceptor 74 includes four through holes 79 which allow lift pins 12 of the transfer mechanism 10 to be described later to penetrate for transferring the semiconductor wafer W.

Figure 5:
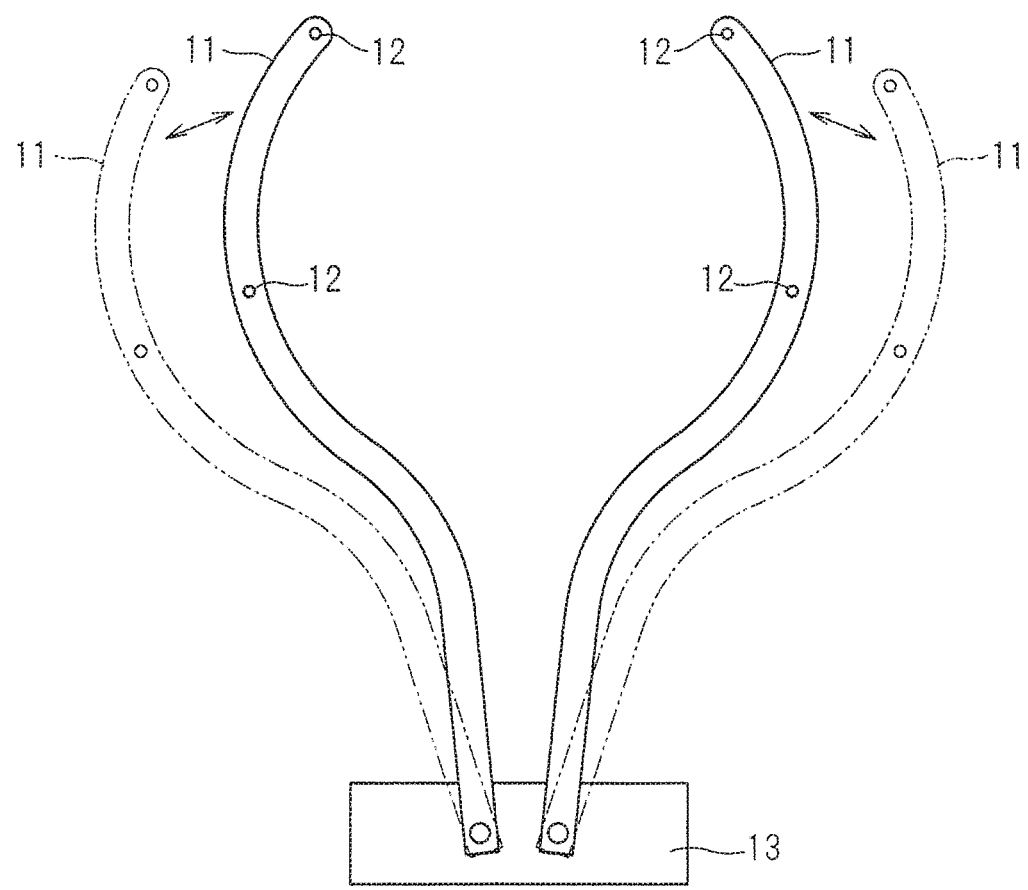
FIG. 5 is a plan view of a transfer mechanism.
Figure 6:
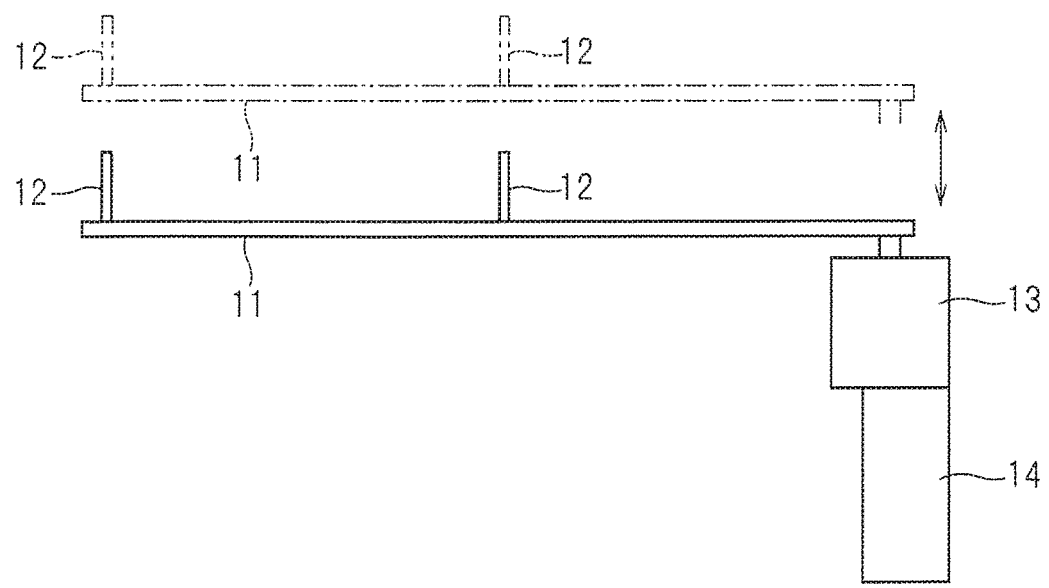
FIG. 6 is a side view of the transfer mechanism.

FIG. 5 is a plan view of the transfer mechanism 10. FIG. 6 is a side view of the transfer mechanism 10. The transfer mechanism 10 includes two transfer arms 11. The transfer arms 11 have an arcuate shape to fit the recessed portion 62 that is roughly annular. Each of the transfer arms 11 includes the two lift pins 12 mounted upright thereon. The transfer arms 11 are pivotable by a horizontal movement mechanism 13. The horizontal movement mechanism 13 horizontally moves the pair of transfer arms 11 between a transfer operation position (a position indicated by solid lines in FIG. 5) in which the semiconductor wafer W is transferred to and from the holder 7 and a retracted position (a position indicated by dash-double-dot lines in FIG. 5) in which the transfer arms 11 do not overlap the semiconductor wafer W held by the holder 7 in a plan view. The horizontal movement mechanism 13 may cause individual motors to pivot the respective transfer arms 11. Alternatively, a linkage mechanism may cause a single motor to pivot the pair of transfer arms 11 in a cooperative manner.

The pair of transfer arms 11 are moved upward and downward by an elevating mechanism 14 together with the horizontal movement mechanism 13. When the elevating mechanism 14 moves up the pair of transfer arms 11 to their transfer operation position, the four lift pins 12 in total pass through the respective four through holes 79 (see FIGS. 2 and 3) bored in the susceptor 74 so that the upper ends of the lift pins 12 protrude from the upper surface of the susceptor 74. On the other hand, when the elevating mechanism 14 moves down the pair of transfer arms 11 at their transfer operation position to take the lift pins 12 out of the respective through holes 79 and the horizontal movement mechanism 13 moves the pair of transfer arms 11 to be opened, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62.

Referring again to FIG. 1, the flash heater 5 provided over the chamber 6 includes, inside an enclosure 51, a light source including the multiple (30 in the present preferred embodiment) xenon flash lamps FL, and a reflector 52 to cover the upper portion of the light source. The flash heater 5 further includes a lamp light radiation window 53 mounted to the bottom of the enclosure 51. The lamp light radiation window 53 forming the floor of the flash heater 5 is a plate-like quartz window made of quartz. The flash heater 5 is provided over the chamber 6, whereby the lamp light radiation window 53 is opposed to the top chamber window 63. The flash lamps FL emit flashlights to the heat treatment space 65 from over the chamber 6 through the lamp light radiation window 53 and the top chamber window 63.

The plurality of flash lamps FL, each of which is a rod-shaped lamp having an elongated cylindrical shape, are arranged in a plane so that the longitudinal directions of the respective flash lamps FL are in parallel with each other along a main surface of the semiconductor wafer W held by the holder 7 (that is, in a horizontal direction). Thus, a plane defined by the arrangement of the flash lamps FL is also a horizontal plane.

The xenon flash lamp FL includes a rod-shaped glass tube (discharge tube) containing xenon gas sealed therein and having positive and negative electrodes on opposite ends thereof that are connected to a capacitor, and a trigger electrode attached to the outer peripheral surface of the glass tube. Even if charges accumulate on the capacitor, no electricity will flow through the glass tube in a normal state because the xenon gas is an electrical insulator. However, when a high voltage is applied to the trigger electrode to cause an electrical breakdown, the electricity accumulated in the capacitor momentarily flows through the glass tube, so that excitation of xenon atoms or molecules at this time causes light to be emitted. Since the electrostatic energy accumulated in advance in the capacitor of the xenon flash lamp FL is transformed into very short light pulses ranging from 0.1 to 100 milliseconds, the xenon flash lamp FL is characterized by the possibility of emitting more intense light than the continuous lighting light source such as the halogen lamps HL. In other words, the xenon flash lamp FL is a pulse emitting lamp that momentarily emits light in a very short period of time that is less than one second. The light emission time of the flash lamps FL can be adjusted by a coil constant of a lamp light source that supplies power to the flash lamps FL.

The reflector 52 is provided over the plurality of flash lamps FL to cover all of the flash lamps FL. A fundamental function of the reflector 52 is to reflect the flashlights emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heater 4 provided under the chamber 6 includes, inside an enclosure 41, the multiple (40 in the present preferred embodiment) halogen lamps HL. The halogen heater 4 is a light emitter that directs light from under the chamber 6 toward the heat treatment space 65 through the bottom chamber window 64 to heat the semiconductor wafer W by means of the halogen lamps HL.

Figure 7:
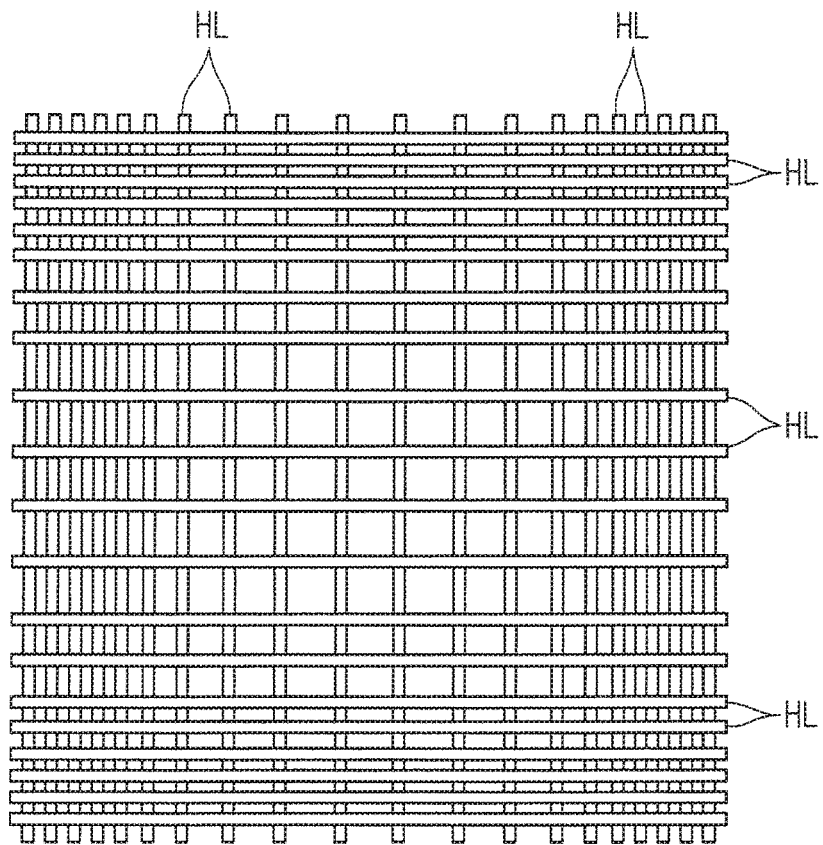
FIG. 7 is a plan view showing an arrangement of multiple halogen lamps.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper tier and the lower tier are arranged so that the longitudinal directions thereof are in parallel with each other along the main surface of the semiconductor wafer W held by the holder 7 (that is, in a horizontal direction). Thus, a plane defined by the arrangement of the halogen lamps HL in each of the upper and lower tiers is a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. When the semiconductor wafer W is heated by the halogen heater 4 through light emission, a greater amount of light can impinge upon the peripheral portion of the semiconductor wafer W subject to a temperature decrease.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine, and the like) in trace amounts into an inert gas such as nitrogen, argon, and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. In other words, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heater 4 under the halogen lamps HL arranged in two tiers (FIG. 1). The reflector 43 reflects the light emitted from the plurality of halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data, and the like therein. The CPU in the controller 3 executes a predetermined processing program, whereby the processes in the heat treatment apparatus 1 proceed. The controller 3 controls the valves 84 and 89, the flow rate adjustment valves 90 and 196, the exhaust pump 191, and the three exhaust valves 192, 193, and 194 to adjust the pressure, the flow rate of gas supplied, and the exhaust rate of the heat treatment space 65 in the chamber 6.

The heat treatment apparatus 1 further includes, in addition to the aforementioned components, various cooling structures to prevent an excessive temperature rise in the halogen heater 4, the flash heater 5, and the chamber 6 due to the heat energy generated from the halogen lamps HL and the flash lamps FL during the heat treatment of the semiconductor wafer W. For example, a water cooling tube (not shown) is provided in the walls of the chamber 6. Also, the halogen heater 4 and the flash heater 5 have an air cooling structure for generating a gas flow therein to exhaust heat. Air is supplied to a gap between the top chamber window 63 and the lamp light radiation window 53 to cool down the flash heater 5 and the top chamber window 63.

Next, the procedure for processing the semiconductor wafer W in the heat treatment apparatus 1 will be described. The semiconductor wafer W to be treated herein is a semiconductor substrate on which a high dielectric constant thin film is formed as a gate insulating film. The heat treatment apparatus 1 executes post deposition annealing (PDA) by emitting a flashlight to the semiconductor wafer W to eliminate defects in the high dielectric constant thin film.

FIG. 9 illustrates a stack structure in which the high dielectric constant thin film is deposited on the semiconductor wafer W. A silicon oxide film ($SiO_2$) 102 is formed on a silicon substrate 101 of the semiconductor wafer W. The silicon oxide film 102 is a necessary layer as an interface layer film between the silicon substrate 101 and a high dielectric constant thin film 103. The silicon oxide film 102 is very thin, for example, approximately 1 nm thick. Various known methods such as thermal oxidation are applicable as a method for forming the silicon oxide film 102.

Then, the high dielectric constant thin film 103 is formed on the silicon oxide film 102 as a gate insulating film. A high-dielectric constant material, for example, $HfO_2$, $ZrO_2$, $Al_2O_3$, or $La_2O_3$ can be used for the high dielectric constant thin film 103 ($HfO_2$ in the preferred embodiment). The high dielectric constant thin film 103 is formed by, for example, depositing the high-dielectric constant material on the silicon oxide film 102 by Atomic Layer Deposition (ALD). The high dielectric constant thin film 103 to be deposited on the silicon oxide film 102 is several nm thick, and has an equivalent oxide thickness (EOT) of approximately 1 nm. The method for forming the high dielectric constant thin film 103 is not limited to ALD but can be a known method such as metal-organic chemical vapor deposition (MOCVD). In any of these methods, the high dielectric constant thin film 103 that remains deposited without any special treatment has many defects such as point defect. Sidewalls 104, which are made of SiN and formed on both sides of the high dielectric constant thin film 103 in the structure illustrated in FIG. 9, are formed, for example, prior to formation of the high dielectric constant thin film 103 in a gate-last process. After the heating treatment by the heat treatment apparatus 1, titanium (Ti) or titanium nitride (TiN) is deposited on the high dielectric constant thin film 103 as a metal gate.

The heat treatment apparatus 1 performs the heating treatment on the semiconductor wafer W obtained by forming the high dielectric constant thin film 103 on the silicon substrate 101 to sandwich the silicon oxide film 102 in between as illustrated in FIG. 9. Next, the operating procedure in the heat treatment apparatus 1 will be described. The controller 3 controls the operating mechanisms provided in the heat treatment apparatus 1, so that the operating procedure in the heat treatment apparatus 1 will proceed.

First, the semiconductor wafer W obtained by forming the high dielectric constant thin film 103 on the silicon oxide film 102 that is an interface layer film is transported into the chamber 6 of the heat treatment apparatus 1. When the semiconductor wafer W is transported, the gate valve 185 is opened to open the transport opening 66. A transport robot outside the heat treatment apparatus 1 transports the semiconductor wafer W in which the high dielectric constant thin film 103 is formed, into the heat treatment space 65 of the chamber 6 through the transport opening 66. Since the pressure inside and outside the chamber 6 is the atmospheric pressure, air is entrained in the heat treatment space 65 of the chamber 6 along with transporting of the semiconductor wafer W. Here, continuous supply of nitrogen gas from the gas supply source 85 with the valve 84 opened may allow nitrogen gas streams to flow out of the transport opening 66 to prevent the atmosphere outside the heat treatment apparatus 1 from flowing into the chamber 6 as much as possible. Furthermore, it is preferred to increase the supply flow rate of nitrogen gas when the gate valve 185 is opened more than that during the heat treatment of the semiconductor wafer W (for example, the supply flow rate is 120 liters/minute when the gate valve 185 is opened if the supply flow rate is normally 30 liters/minute during the heat treatment). It is also preferred to close the valve 89 to stop exhaust from the chamber 6 as well as increasing the supply flow rate of nitrogen gas. Since the nitrogen gas supplied to the chamber 6 flows only out of the transport opening 66, the outside air can be more efficiently prevented from flowing in.

The semiconductor wafer W transported by the transport robot is moved forward to a position lying immediately over the holder 7 and is stopped. Then, the pair of transfer arms 11 of the transfer mechanism 10 is moved horizontally from the retracted position to the transfer operation position and is then moved upward, whereby the lift pins 12 pass through the through holes 79 and protrude from the upper surface of the susceptor 74 to receive the semiconductor wafer W.

After the semiconductor wafer W is placed on the lift pins 12, the transport robot moves out of the heat treatment space 65, and the gate valve 185 closes the transport opening 66. Then, the pair of transfer arms 11 moves downward to transfer the semiconductor wafer W from the transfer mechanism 10 to the susceptor 74 of the holder 7, so that the semiconductor wafer W is held in a horizontal attitude. The semiconductor wafer W is held by the susceptor 74, assuming that the surface on which the high dielectric constant thin film 103 is formed is the upper surface. The semiconductor wafer W is also held inside the five guide pins 76 on the upper surface of the susceptor 74. The pair of transfer arms 11 moved downward below the susceptor 74 is moved back to the retracted position, i.e. to the inside of the recessed portion 62, by the horizontal movement mechanism 13.

Figure 10:
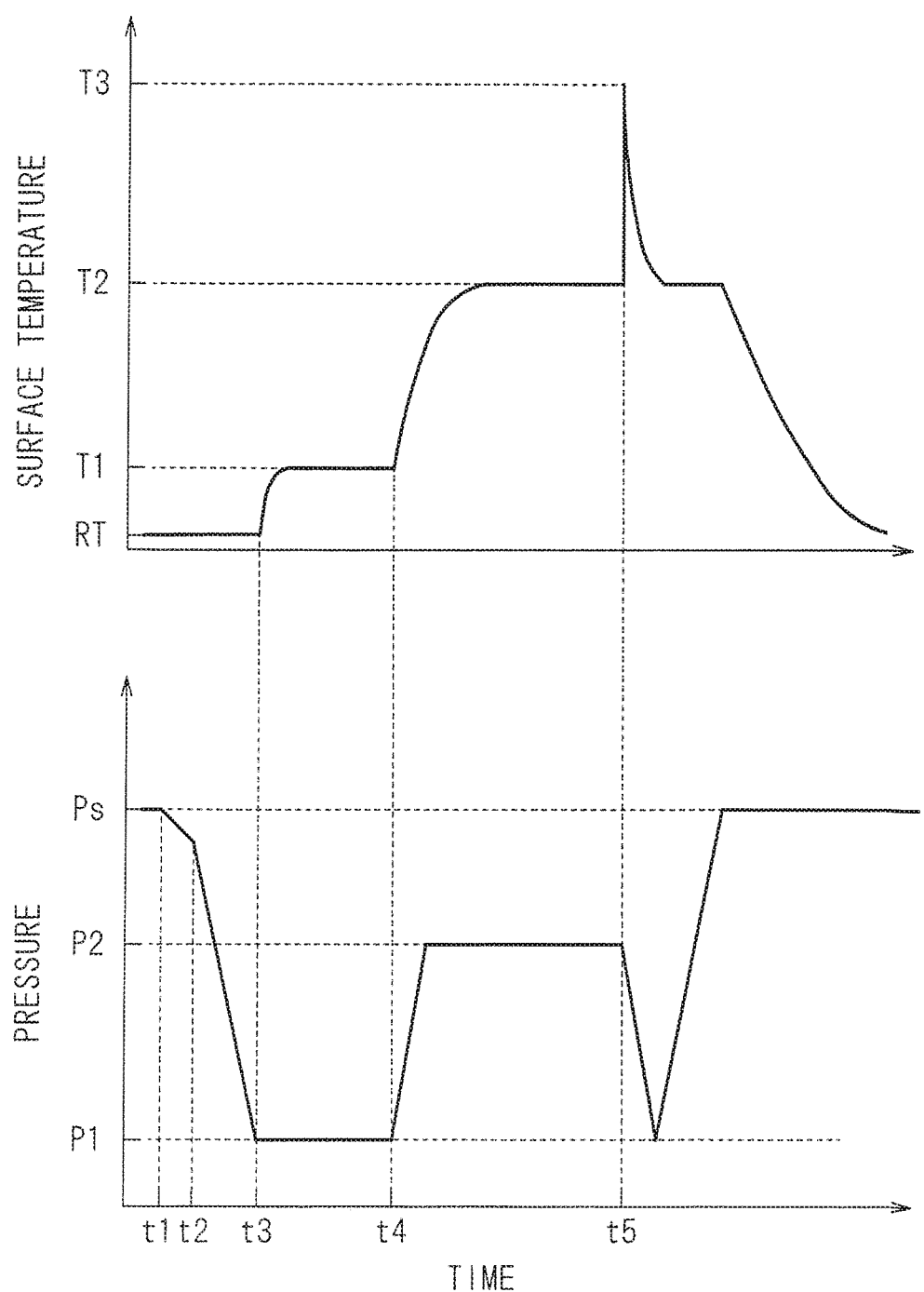
FIG. 10 illustrates changes in the pressure in a chamber and the temperature of the semiconductor wafer.

After the semiconductor wafer W is housed in the chamber 6 and the transport opening 66 is closed by the gate valve 185, adjustment of the atmosphere in the chamber 6 and the heat treatment of the semiconductor wafer W are started. FIG. 10 illustrates changes in the pressure in the chamber 6 and the temperature of the semiconductor wafer W. The lower portion in FIG. 10 illustrates the change in the pressure in the chamber 6, and the upper portion in FIG. 10 illustrates the change in the temperature of the semiconductor wafer W. The horizontal axis represents time both in the upper and lower portions in FIG. 10. The vertical axis in the upper portion represents the surface temperature of the semiconductor wafer W, and the vertical axis in the lower portion represents the pressure in the chamber 6.

When the transport opening 66 is closed after the semiconductor wafer W is transported, the heat treatment space 65 in the chamber 6 is made airtight. The pressure in the chamber 6 at this time is an ordinary pressure Ps (the atmospheric pressure=approximately 101,325 Pa). Then, the pressure in the chamber 6 starts to be reduced at the time t1. Under a reduced pressure, the valve 84 for gas supply is closed, and the valve 89 for exhaust is opened. In the initial phase of the reduced pressure, the controller 3 opens the exhaust valve 192 provided on the bypass line 197 whose pipe diameter is the smallest among the three bypass lines 197, 198, and 199 while operating the exhaust pump 191. The other exhaust valves 193 and 194 are closed. Thus, the pressure in the heat treatment space 65 in the chamber 6 is reduced by exhaust without supplying any gas to the chamber 6. In the initial phase of the reduced pressure, the exhaust flow rate is small and the exhaust speed is relatively slow because only the bypass line 197 whose pipe diameter is the smallest among the three bypass lines 197, 198, and 199 is used. The heat treatment on the semiconductor wafer W is not performed at this time. Thus, the semiconductor wafer W remains at the room temperature RT.

Next, the controller 3 opens all the three exhaust valves 192, 193, and 194 when the pressure in the chamber 6 reaches approximately 20 kPa at the time t2. This increases the exhaust flow rate from the chamber 6, and also the exhaust speed. Then, the pressure (degree of vacuum) in the chamber 6 reaches the pressure P1 at the time t3. The pressure P1 is, for example, approximately 10 Pa. In other words, the exhaust with a low exhaust flow rate in the initial phase of the reduced pressure follows the exhaust with a higher exhaust flow rate switched from the low exhaust flow rate. The flow rate of the flow rate adjustment valve 196 is constant according to the preferred embodiment.

Rapid exhaust at a high exhaust flow rate from the start of pressure reduction may cause large change in gas flow in the chamber 6, raise particles adhered to the structure of the chamber 6 (for example, the bottom chamber window 64), and contaminate the semiconductor wafer W by redeposition of the particles. The still exhaust with the low exhaust flow rate in the initial phase of the reduced pressure following the exhaust with a higher exhaust flow rate switched from the low flow rate can prevent the particles in the chamber 6 from rising.

At the time t3 when the pressure in the chamber 6 reaches the pressure P1, the pressure in the chamber 6 is maintained at the pressure P1 by making the supply flow rate of nitrogen gas to the chamber 6 equal to the exhaust flow rate from the chamber 6. Specifically, the pressure in the chamber 6 is maintained at the pressure P1 by supplying nitrogen gas to the chamber 6 at a supply flow rate in trace amounts using the flow rate adjustment valve 90 with the valve 84 opened and also by reducing the exhaust flow rate using the flow rate adjustment valve 196. In other words, the pressure in the chamber 6 is maintained at the pressure P1 by balancing the supply flow rate of nitrogen gas defined by the flow rate adjustment valve 90 and the exhaust flow rate defined by the flow rate adjustment valve 196.

At the time t3 when the pressure in the chamber 6 reaches the pressure P1, the 40 halogen lamps HL in the halogen heater 4 are simultaneously turned on to start preheating (assist heating) of the semiconductor wafer W. The halogen light emitted from the halogen lamps HL is transmitted through the bottom chamber window 64 and the susceptor 74 both made of quartz, and impinges upon the back surface of the semiconductor wafer W. The back surface of the semiconductor wafer W is the main surface opposite to the front surface on which the high dielectric constant thin film 103 is formed. Receipt of the light from the halogen lamps HL increases the temperature of the semiconductor wafer W. The transfer arms 11 of the transfer mechanism 10, which are retracted to the inside of the recessed portion 62, do not become an obstacle to the heating using the halogen lamps HL.

The temperature of the semiconductor wafer W is measured by the contact thermometer 130 when the halogen lamps HL perform the preheating. Specifically, the contact thermometer 130 including the thermocouple measures the temperature of the wafer at elevated temperatures by contacting, through the cutout portion 77, the lower surface of the semiconductor wafer W held by the susceptor 74. The measured temperature of the semiconductor wafer W is transmitted to the controller 3. The controller 3 controls the output from the halogen lamps HL while monitoring whether the temperature of the semiconductor wafer W, which will be increased by the emission of light from the halogen lamps HL, reaches a predetermined first preheating temperature T1. In other words, the controller 3 provides, based on a measurement value of the contact thermometer 130, feedback control of the output from the halogen lamps HL so that the temperature of the semiconductor wafer W is equal to the first preheating temperature T1. The first preheating temperature T1 ranges from 100 to 200° C., and is 150° C. according to the preferred embodiment. When the temperature of the semiconductor wafer W is increased by the emission of light from the halogen lamps HL, the radiation thermometer 120 is not used for measuring the temperature. This is because the halogen light emitted from the halogen lamps HL enters the radiation thermometer 120 as ambient light. Thus, the radiation thermometer 120 cannot measure the temperature accurately.

After the temperature of the semiconductor wafer W reaches the first preheating temperature T1, the controller 3 tentatively maintains the semiconductor wafer W at the first preheating temperature T1. Specifically, the controller 3 adjusts the output from the halogen lamps HL when the temperature of the semiconductor wafer W measured by the contact thermometer 130 reaches the first preheating temperature T1 to maintain the temperature of the semiconductor wafer W almost at the first preheating temperature T1. While the temperature of the semiconductor wafer W is maintained at the first preheating temperature T1, the pressure in the chamber 6 is maintained at the pressure P1.

Heating the semiconductor wafer W at the first preheating temperature T1 that is a relatively low temperature ranging from 100 to 200° C. under a reduced atmospheric pressure of approximately 10 Pa enables, for example, the moisture absorbed on the surface of the semiconductor wafer W in trace amounts to be desorbed from the surface (degassing). The elements such as the moisture desorbed from the surface of the semiconductor wafer W are released into the heat treatment space 65 and then exhausted from the gas exhaust pipe 88 to the outside of the chamber 6.

Next at the time t4 after predetermined time lapses since the temperature of the semiconductor wafer W reaches the first preheating temperature T1, the controller 3 increases the output of the 40 halogen lamps HL in the halogen heater 4 to further increase the temperature of the semiconductor wafer W from the first preheating temperature T1. The controller 3 provides, based on the measurement value of the contact thermometer 130, the feedback control of the output from the halogen lamps HL so that the temperature of the semiconductor wafer W is equal to a second preheating temperature T2. The second preheating temperature T2 ranges from 500 to 700° C., and is 600° C. according to the preferred embodiment. After the temperature of the semiconductor wafer W reaches the second preheating temperature T2, the controller 3 tentatively maintains the semiconductor wafer W at the second preheating temperature T2.

At the time t4 simultaneously when the output of the halogen lamps HL is increased, the gas supply source 85 supplies a mixed gas of ammonia and nitrogen gas functioning as diluent gas to the heat treatment space 65 in the chamber 6 while the supply flow rate defined by the flow rate adjustment valve 90 is increased. As a result, the ammonia atmosphere is formed around the semiconductor wafer W held by the holder 7 in the chamber 6. The concentration of ammonia in the ammonia atmosphere (i.e., a mixing ratio of ammonia and nitrogen gas) is not particularly limited but can be an appropriate value or may be, for example, lower than or equal to 10 vol. % (approximately 2.5 vol. % in the preferred embodiment). The exhaust from the chamber 6 may be continued while the mixed gas of ammonia and nitrogen is supplied to the chamber 6. Obviously, the supply flow rate of the mixed gas is larger than the exhaust flow rate.

Supplying the mixed gas to the chamber 6 increases the pressure in the chamber 6 to be restored from the pressure P1 to the pressure P2. The pressure P2, which is higher than the pressure P1 and is lower than the ordinary pressure Ps, is approximately 5,000 Pa, for example. Since the pressure in the chamber 6 is temporarily reduced to the pressure P1 and then restored to the pressure P2 higher than the pressure P1 according to the preferred embodiment, the concentration of oxygen in the chamber 6 after the pressure restoration can be lower than or equal to approximately 200 ppb.

After the pressure in the chamber 6 is restored to the pressure P2, the pressure in the chamber 6 is maintained at the pressure P2 by making the supply flow rate of the mixed gas of ammonia and nitrogen to be supplied to the chamber 6 equal to the exhaust flow rate from the chamber 6. While the temperature of the semiconductor wafer W is maintained at the second preheating temperature T2, the pressure in the chamber 6 is maintained at the pressure P2.

Heating the semiconductor wafer W at the second preheating temperature T2 ranging from 500 to 700° C. under a reduced atmospheric pressure of approximately 5,000 Pa uniformly preheats the whole semiconductor wafer W including the high dielectric constant thin film 103. Since the temperature of the peripheral portion of the semiconductor wafer W from which heat is more easily dissipated tends to decrease more than that of the central portion thereof in the preheating phase using the halogen lamps HL, the halogen lamps HL in the halogen heater 4 are disposed at a higher density in a region opposed to the peripheral portion of the semiconductor wafer W than that in a region opposed to the central portion thereof. This allows a greater amount of light to impinge upon the peripheral portion of the semiconductor wafer W from which heat is easily dissipated, and allows the plane temperature distribution of the semiconductor wafer W in the preheating phase to be uniform.

Next, at the time t5 after predetermined time lapses since the temperature of the semiconductor wafer W reaches the second preheating temperature T2, the flash lamps FL flash to execute the flash heating treatment. Part of the flashlights emitted from the flash lamps FL is directly directed into the chamber 6, and another part thereof is temporarily reflected by the reflector 52 and then directed into the chamber 6. The flash heating of the semiconductor wafer W is performed with emission of these flashlights.

Since the flash heating is performed with emission of the flashlight (flashes) from the flash lamps FL, the front surface temperature of the semiconductor wafer W can be increased in a short period of time. In other words, the flashlights emitted from the flash lamps FL are intense flashes whose emission time is very short and approximately ranges from 0.1 to 100 milliseconds and which are very short light pulses transformed from the electrostatic energy accumulated in advance in the capacitors. Emitting the flashlights from the flash lamps FL to the front surface of the semiconductor wafer W obtained by forming the high dielectric constant thin film 103 on the silicon substrate 101 to sandwich the silicon oxide film 102 in between momentarily increases the temperature of the front surface of the semiconductor wafer W including the high dielectric constant thin film 103 up to a treatment temperature T3 to execute the post deposition annealing. The treatment temperature T3 is the highest temperature (peak temperature) at which the front surface of the semiconductor wafer W may reach with emission of the flashlights. The treatment temperature T3 ranges from 1000 to 1100° C., and is 1000° C. according to the preferred embodiment.

Upon execution of the post deposition annealing on the front surface of the semiconductor wafer W whose temperature has been increased to the treatment temperature T3 in the ammonia atmosphere, nitridation proceeds in the high dielectric constant thin film 103 and the defects such as point defect in the high dielectric constant thin film 103 are eliminated. Since the emission time of the flash lamps FL is a very short time approximately ranging from 0.1 to 100 milliseconds, the time necessary for increasing the front surface temperature of the semiconductor wafer W from the second preheating temperature T2 to the treatment temperature T3 is also a very short time less than 1 second. The front surface temperature of the semiconductor wafer W after emission of the flashlights immediately drops from the treatment temperature T3.

After the flash heating treatment, the pressure in the chamber 6 is reduced again to the pressure P1 with the valve 84 for gas supply closed and by increasing the exhaust flow rate from the chamber 6. Here, the exhaust flow rate may be switched in two steps as described above. Reduction of the pressure in the chamber 6 again to the pressure P1 enables harmful ammonia to be exhausted from the heat treatment space 65 in the chamber 6. Then, nitrogen gas is supplied from the gas supply source 85 into the chamber 6 with the valve 89 for exhaust closed and with the valve 84 for gas supply opened to restore the pressure to the ordinary pressure Ps.

Turning off the halogen lamps HL lowers the temperature of the semiconductor wafer W from the second preheating temperature T2. The contact thermometer 130 or the radiation thermometer 120 measures the temperature of the semiconductor wafer W at lowered temperatures, and transmits a result of the measurement to the controller 3. The controller 3 monitors whether the temperature of the semiconductor wafer W is lowered to a predetermined temperature, based on the result of measurement. After the temperature of the semiconductor wafer W is lowered to the predetermined temperature or below, the pair of transfer arms 11 of the transfer mechanism 10 is moved horizontally again from the retracted position to the transfer operation position and is then moved upward, so that the lift pins 12 protrude from the upper surface of the susceptor 74 to receive the heat-treated semiconductor wafer W from the susceptor 74. Subsequently, the transport opening 66 closed by the gate valve 185 is opened, and the transport robot outside the heat treatment apparatus 1 transports the semiconductor wafer W placed on the lift pins 12 to the outside. Thus, the heat treatment apparatus 1 completes the heating treatment of the semiconductor wafer W.

After the semiconductor wafer W is heated at the first preheating temperature T1 ranging from 100 to 200° C. with emission of the light from the halogen lamps HL, the temperature of the semiconductor wafer W is increased to the second preheating temperature T2 ranging from 500 to 700° C. for preheating according to the preferred embodiment. Heating the semiconductor wafer W at the first preheating temperature T1 that is a relatively low temperature ranging from 100 to 200° C. before execution of the conventional preheating enables, for example, the moisture absorbed on the surface of the semiconductor wafer W in trace amounts to be desorbed from the surface.

Since the high dielectric constant thin film 103 that remains deposited without any special treatment has many defects such as point defect as described above, such defects need to be eliminated by the post deposition annealing (PDA). Upon execution of the post deposition annealing, the silicon oxide film 102 formed as the foundation of the high dielectric constant thin film 103 takes in oxygen if it is present, and increases in thickness through growth, thus failing to obtain a high dielectric constant. Since, for example, the moisture absorbed on the surface of the semiconductor wafer W is desorbed before the flash heating treatment according to the preferred embodiment, the flash heating treatment can be performed with oxygen derived from such absorption removed as much as possible. Thus, it is possible to prevent the thickness of the silicon oxide film 102 formed as the foundation of the high dielectric constant thin film 103 from increasing by oxidation during the flash heating treatment.

The pressure in the chamber 6 is temporarily reduced to the pressure P1 lower than the atmospheric pressure, and then the mixed gas of ammonia and nitrogen is supplied to the chamber 6 to restore the pressure. Thus, the concentration of oxygen in the chamber 6 after the pressure restoration can be lower than or equal to approximately 200 ppb. Consequently, the flash heating treatment can be performed while oxygen remaining in the chamber 6 is removed as much as possible.

The high dielectric constant thin film 103 immediately after deposition also contains oxygen. When the treatment time of the post deposition annealing exceeds approximately several seconds, diffusion of the oxygen increases the thickness of the silicon oxide film 102. The flash lamps FL emit flashlights to the front surface of the semiconductor wafer W for the emission time less than one second to increase the temperature of the wafer surface to the treatment temperature T3 in a very short period of time according to the preferred embodiment. Thus, the treatment time of the post deposition annealing is so short that there is no sufficient time to diffuse oxygen, which can prevent the thickness of the silicon oxide film 102 formed as the foundation of the high dielectric constant thin film 103 from increasing.

While the preferred embodiment according to the present invention has been described hereinabove, various modifications of the present invention in addition to those described above may be made without departing from the scope and spirit of the invention. After the pressure in the chamber 6 is temporarily reduced to the pressure P1, the pressure is restored to the pressure P2 lower than the atmospheric pressure according to the preferred embodiment. In place of this process, for example, the pressure in the chamber 6 may be restored to the ordinary pressure Ps or to the pressure higher than the atmospheric pressure (for example, approximately 0.15 MPa). When the pressure in the chamber 6 is restored to the pressure higher than the atmospheric pressure, the flash heating treatment is performed under increased pressure. Thus, the partial pressure of ammonia increases, and the treatment temperature T3 can be reduced to a lower temperature.

Although the exhaust flow rate is switched in two steps for exhaust from the chamber 6 according to the preferred embodiment, this may be switched in multiple steps more than or equal to three steps. The flow rate adjustment valve 196 may increase the exhaust flow rate from the chamber 6 continuously without any steps. This can effectively prevent the particles caused by the rapid change in the exhaust flow rate from rising.

The flow rate of gas supplied to the chamber 6 may be changed in multiple steps more than or equal to two steps or without any steps when the pressure in the chamber 6 is restored from the pressure P1.

The semiconductor wafer W to be treated by the heat treatment apparatus 1 is not limited to the semiconductor wafer W obtained by forming the high dielectric constant thin film 103 as a gate insulating film on the silicon oxide film 102 but may be the semiconductor wafer W obtained by further depositing a metal gate on the high dielectric constant thin film 103. Example materials of the metal gate may include titanium nitride (TiN), titanium aluminum (TiAl), and tungsten (W). Alternatively, the semiconductor wafer W to be treated may be the one on which silicide or a germanide obtained by forming a metal film with the flash heating treatment is formed. Alternatively, the semiconductor wafer W to be treated may activate the implanted impurities through the flash heating treatment.

According to the preferred embodiment, the halogen light emitted from the halogen lamps HL is transmitted through the bottom chamber window 64 and the susceptor 74, and impinges upon the back surface of the semiconductor wafer W to preheat the semiconductor wafer W at the first preheating temperature T1. The preferred embodiment is not limited to such. For example, the susceptor 74 is preheated up to a predetermined temperature (for example, approximately 200° C.) through emission of the halogen light from the halogen lamps HL before the semiconductor wafer W is transported to the chamber 6. Then, the semiconductor wafer W is transferred to the susceptor 74 to be held on the susceptor 74, so that semiconductor wafer W may be preheated up to the first preheating temperature T1 (ranging from 100 to 200° C., for example, 150° C.) by thermal radiation from the susceptor 74. Another possible method for preheating the susceptor 74 up to a predetermined temperature is injecting an inert gas such as heated nitrogen into the susceptor 74.

EXPLANATION OF REFERENCE SIGNS 1 heat treatment apparatus
3 controller
4 halogen heater
5 flash heater
6 chamber
7 holder
10 transfer mechanism
61 chamber side portion
63 top chamber window
64 bottom chamber window
65 heat treatment space
74 susceptor
85 gas supply source
90, 196 flow rate adjustment valve
101 substrate
102 silicon oxide film
103 high dielectric constant thin film
190 exhaust part
191 exhaust pump
192, 193, 194 exhaust valve
197, 198, 199 bypass line
FL flash lamp
HL halogen lamp
W semiconductor wafer

The invention claimed is:

1. A heat treatment method for heating a substrate by emitting a flashlight to the substrate, the method comprising the steps of:
   (a) transporting the substrate into a chamber;
   (b) degassing the substrate by heating the substrate in the chamber at a first preheating temperature ranging from 100 to 200° C.;
   (c) preheating the substrate in the chamber at a second preheating temperature higher than the first preheating temperature; and
   (d) emitting the flashlight from a flash lamp to a front surface of the substrate,
   wherein a gas in the chamber is exhausted to reduce a pressure in the chamber into a first pressure lower than an atmospheric pressure in the step (b), and wherein the pressure in the chamber is restored from the first pressure to a second pressure higher than the first pressure in the step (c).

\* \* \* \* \*